US006546833B1

(12) United States Patent
Gifford et al.

(10) Patent No.: US 6,546,833 B1
(45) Date of Patent: Apr. 15, 2003

(54) FLEXIBLE CIRCUIT CUTTING APPARATUS AND METHOD HAVING INDEXING AND REGISTRATION MECHANISM

(75) Inventors: Ralph Gifford, Overland Park, KS (US); Hongli Du, Olathe, KS (US); James T. Gramling, Overland Park, KS (US)

(73) Assignee: Preco Industries, Inc., Lenexa, KS (US)

( * ) Notice: Subject to any disclaimer, the term of this patent is extended or adjusted under 35 U.S.C. 154(b) by 0 days.

(21) Appl. No.: 09/492,960

(22) Filed: Jan. 28, 2000

(51) Int. Cl.[7] .................................................. B26D 5/00
(52) U.S. Cl. ............................ 83/34; 83/365; 83/368; 83/371; 83/559; 83/929.1
(58) Field of Search ............................. 83/365, 371, 34, 83/929.1, 368, 50, 559, 560, 561, 562; 700/192, 206

(56) References Cited

U.S. PATENT DOCUMENTS

| | | | | |
|---|---|---|---|---|
| 3,686,992 A | * | 8/1972 | Daniels ........................ | 83/559 |
| 4,391,174 A | * | 7/1983 | Smeets ........................ | 83/561 |
| 4,541,317 A | * | 9/1985 | Van Humbeeck et al. ...... | 83/34 |
| 4,555,968 A | * | 12/1985 | Raney et al. ................. | 83/365 |
| 4,621,552 A | * | 11/1986 | Lopez ........................ | 83/929.1 |
| 4,696,211 A | * | 9/1987 | Bitzel ........................ | 83/559 |
| 4,697,485 A | | 10/1987 | Raney | |
| 4,869,141 A | * | 9/1989 | Klingel ........................ | 83/559 |
| 5,079,981 A | * | 1/1992 | Singer et al. ................. | 83/365 |
| 5,212,647 A | * | 5/1993 | Raney et al. ................. | 83/34 |
| 5,535,655 A | * | 7/1996 | Kammann .................... | 83/559 |
| 5,568,767 A | | 10/1996 | Jackson | |
| 5,586,479 A | | 12/1996 | Roy et al. | |
| 5,644,979 A | | 7/1997 | Raney | |
| 5,777,878 A | * | 7/1998 | Helmrich et al. ........... | 700/124 |
| 5,777,879 A | | 7/1998 | Sommerfeldt | |
| 5,794,526 A | | 8/1998 | Raney | |
| 6,013,017 A | * | 1/2000 | Aizawa ....................... | 83/559 |

\* cited by examiner

Primary Examiner—Allan N. Shoap
Assistant Examiner—Stephen Choi
(74) Attorney, Agent, or Firm—Hovey Williams LLP

(57) ABSTRACT

A die cutting press (10) having a base platen (12), a bolster (16) shiftably and rotatably mounted on the base platen, and a die unit (22) mounted on the bolster for movement therewith is provided for precision cutting of individual part-defining areas (30, 230) from longitudinal and laterally-arranged rows of part areas of a relatively thin substrate (32, 232) that is susceptible to deformation and warpage during its manufacture and wherein registration indicia (236, 238) is provided in association with each of the part-defining areas. Improved die registration apparatus includes a delivery unit (44) for successively shifting the substrate in order to bring a cross-row (36) of individual part areas into general alignment with the die unit, an indexing device (66) operable to successively shift a cutting die (56) of the die unit laterally ofthe substrate and relative to the bolster into general alignment with successive ones of said part areas, and cutting die registration mechanism connected to the bolster operable to sense and respond to the registration indicium associated with each respective part area to rotate and shift the bolster laterally different distances and angles depending upon distance of the part to be cut from the pivot axis of the bolster.

29 Claims, 10 Drawing Sheets

FLEXIBLE CIRCUIT CUTTING APPARATUS AND METHOD HAVING INDEXING AND REGISTRATION MECHANISM

BACKGROUND OF THE INVENTION

1. Field of the Invention

This invention relates to a die cutting press for cutting a number of areas defining individual parts, from a web or sheet substrate in which the parts are arranged as rows extending along the length of the web or sheet, as well as in cross-rows across the width of the substrate. In particular, the invention relates to a die cutting press which includes die unit indexing and registration apparatus that indexes the die unit across the width of the substrate to bring the die unit into general alignment with each part in a cross-row thereof and then registers the die unit with each individual part before effecting the cutting operation.

2. Description of the Prior Art

Die cutting presses are illustrated and described in U.S. Pat. Nos. 4,555,968, 4,697,485 and 5,212,647, all of which are assigned to the assignee herein. The presses of the '968, '485 and '647 patents are provided with a floating bolster which supports a die unit in which the cutting die is located above a substrate having a part therein to be cut, and in which the die unit is shifted to accomplish the cutting operation after precise registration of the cutting die with the area of the substrate defining the part to be cut. Although especially useful for die cutting of a web having a series of part-defining areas along the length of the web, the presses of these patents also have utility for cutting of parts from a sheet having a plurality of parts in a single row extending along the sheet in the direction of delivery of the individual parts to the die cutting area of the press.

In the die cutting presses of the above-referenced patents, X axis registration (in the direction of feed or travel of the sheet or web into the press) of the die unit is accomplished by control of the infeed mechanism. Y axis registration (across the width of the web or sheet) is controlled by a servo connected to the bolster to thereby shift the die unit. Rotation of the bolster as required for θ angle adjustment is carried out by another servo operable coupled to the bolster for shifting the bolster and thereby the die unit transversely to the direction of infeed of the substrate.

In the die unit registration system of the '647 patent, a registration system is provided in which one or more indicium fixed on the bolster of the press is utilized to indicate the position at which indicium on the substrate web appear when defined areas of the elongated web are in desired predetermined relationship relative to the die unit supported on the floating bolster. A camera vision system is employed to compare the position of indicia on the substrate with a reference indicia in computer control apparatus. The system is then capable of operating the infeed mechanism, and the Y and θ angle adjustment servos connected to the floating bolster to simultaneously move the substrate along the X axis, to shift the bolster along the Y axis, and to rotate the bolster about its pivot axis to adjust the θ angle, as required to precisely align the die unit with part-defining areas of the substrate which have been successively moved into general alignment with the die unit.

The die cutting presses of the '968, '485 and '647 patents are capable of very precisely aligning the die cutting unit with the part to be cut from a web or sheet on a repeatable basis and at a relatively high output rate. However, a sheet or web having a series of individual defined areas comprising parts to be cut by the die unit presents a much more difficult registration problem where the individual parts are arranged in rows extending along the length of the sheet or web, as well as a series of cross-rows of part-defining areas in that it is necessary to shift the die unit laterally of the sheet or web into general alignment with the part-defining area of the substrate in another part area of a cross-row thereof.

The Y axis servo connected to the floating bolster of the '968, '485 and '647 patents was not designed or finctional to shift the entire floating bolster to an extent to bring the die unit into general alignment with the next adjacent part-defining area of the sheet or web in a respective cross-row of the part areas, and such lateral movement would not have been practical because the floating bolster must rotate to perform the θ registration function.

As a consequence, the die unit must be reliably and efficiently shifted laterally of the supporting bolster to bring the die unit into successive general alignment with the parts to be cut in cross-rows of the part-defining areas of the web or sheet. In addition, the die unit must be precisely re-aligned with each part-defining area after or as the die unit is brought into a general alignment with a respective part area independently of the die registration that has been accomplished with the immediately preceding part area to be cut.

The problem presented by the need to cut individual parts from a sheet or web substrate in which the individual part-defining areas are arranged as rows extending along the web or sheet as well as across the sheet is greatly exacerbated when the material to be cut comprises a substrate that has undergone distortion or warpage as a result of the process of manufacturing the product. Exemplary in this respect are substrates such as a plurality of screen printed images on a sheet, web or other backing, in which the images are subject to printing inaccuracies, substrate distortion or other factors that cause the individual images to not all be precisely in the same relative positions on the substrate. Other exemplary products in this respect comprise bio-sensors, and a series of flexible electronic circuit boards or the like in arranged in longitudinally and laterally extending rows on the web or sheet. Electronic circuit boards, for example, have copper areas defining circuits formed or etched thereon. The forming and etching procedures often cause the web or sheet to become distorted as a result of non-uniform forces on the substrate which are a result of the manufacturing process.

Therefore, there has been a need for a die cutting press having the die unit registration attributes of the presses illustrated and described in the '968, '485 and '647 patents, and especially the camera vision system of the '647 patent, which is capable of precisely alignment the die unit with the parts to be cut from a web or sheet in which the individual parts are arranged on the substrate both as rows extending longitudinally of the substrate, as well as in cross-rows thereof spaced laterally one from another. In addition, the die cutting press should be capable of precisely aligning the die unit with each individual part-defining area to be cut, even in those circumstances where the substrate to be processed is not perfectly flat and is somewhat distorted and warped as the result of the manufacturing process for the substrate, or the printing procedures as result for example in screen printing operations.

Object and Summary of the Invention

It is therefore an object of the present invention to provide a die cutting press for precision cutting of individual part-defining areas arranged along and across a relatively thin substrate of the type in which the press has a base platen, a bolster shiftably and rotatably mounted on the base platen, and a die unit supported on and movable with the bolster and wherein an indexing device is connected to the die unit that is operable to successively shift the die unit relatively to the bolster into general alignment with successive ones of the individual defined areas thereby permitting precise alignment of the die unit with the defined area to be cut by simultaneous X axis adjustment of the infeed, and Y axis and θ angle adjustment of the bolster with individual defined areas.

A further important object of the invention is to provide a die cutting press of the type described in which the registration mechanism is operable to rotate the bolster different amounts and to shift the bolster different distances to obtain registration of the die unit with an individual part-defining area generally aligned with the die unit depending upon the distance of the particular individual part area aligned with the die unit from the pivot axis of the floating bolster. Thus, the registration system automatically compensates for the fact that even though the pivot axis for the bolster is fixed, the bolster must be rotated through different angles and must be shifted different distances depending upon the location of the part to be cut from the substrate with respect to the pivot axis of the bolster.

A further object of the invention is to provide die unit registration mechanism for a die cutting press which includes at least one digital camera operable to receive an image of indicium associated with a respective part-defining area of the substrate and that generates data indicative of the position of the indicium sensed by the camera, along with a reference unit providing reference image data representative of the desired position of the indicium associate with the respective part-defining area and thereby that part area with respect to the die unit, and a comparator for comparing the camera-generated indicia with the reference indicia for controlling simultaneous operation of the X axis infeed adjustment, and the Y axis and θ angle adjustment servos connected to the bolster to bring the die unit into precise registered alignment with the part-defining area to be cut.

Also an object of the invention is to provide die unit indexing and registration mechanism for a die cutting press in which an indexing device is provided for successively shifting the die unit across the width of a substrate having longitudinally and laterally extending rows of parts to be cut, in a Y axis direction independently and at a different rate than the Y axis adjustment of the die unit supporting bolster of the press, thereby increasing the speed of operation of the press.

Another object of the invention is to provide a die cutting press as described in which the die unit is successively indexed in one direction across the width of the sheet or web to cut parts from a cross-row thereof, and then successively indexed in the opposite direction across the width of the sheet or web to cut parts from the next adjacent row thereof, thus minimizing movement of the indexing mechanism by virtue of the serpentine path of travel thereof.

DETAILED DESCRIPTION OF THE PREFERRED EMBODIMENTS

Figure 1:
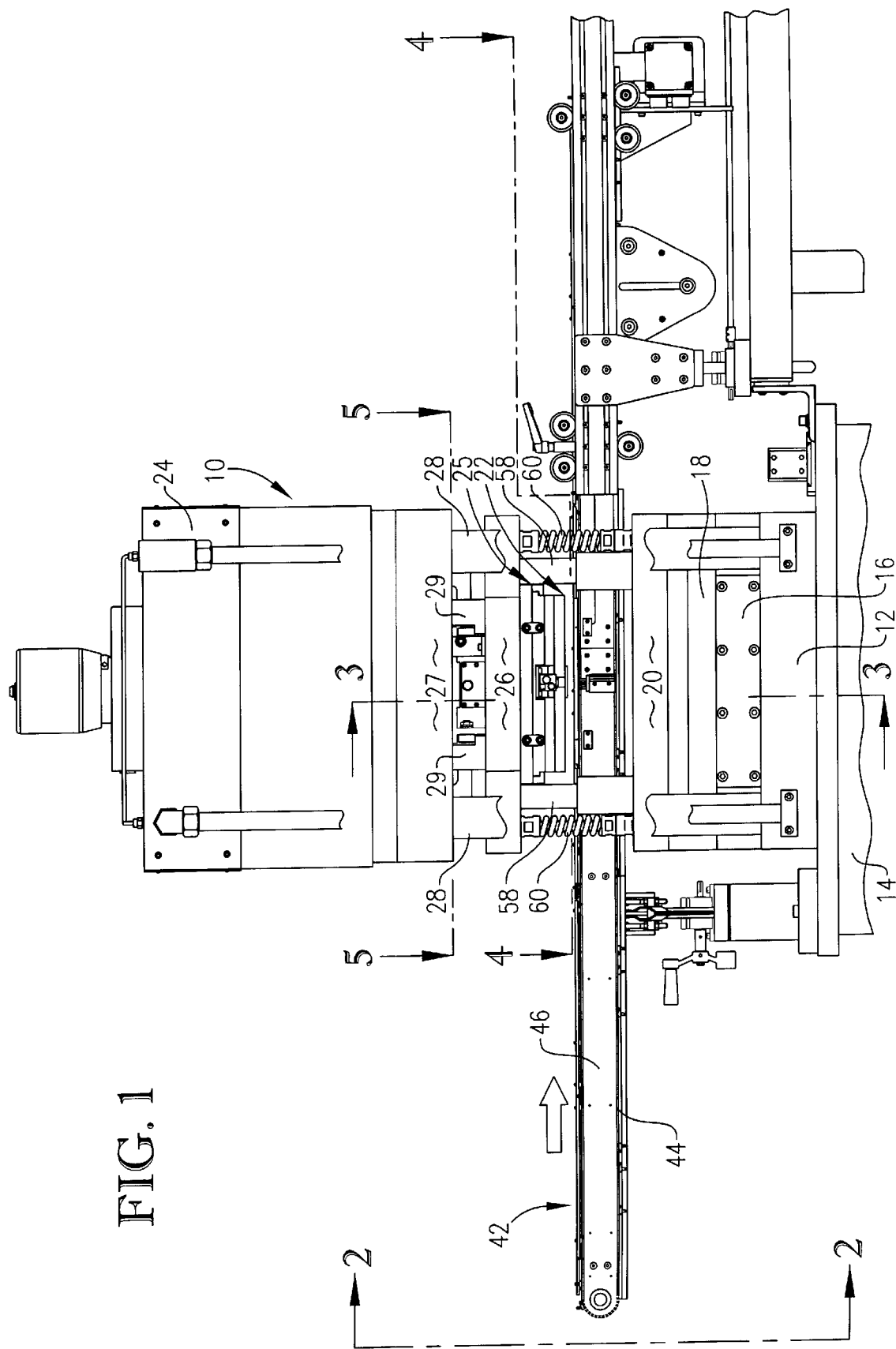
FIG. 1 is a fragmentary, side elevational view of a die cutting press for precision cutting of individual parts from a plurality of a relatively thin web or sheet susceptible to deformation ro warpage during manufacturing and incorporating the improved indexing and registration mechanism of this invention.

The die cutting press 10 shown in side elevation in FIG. 1 of the drawings has components which are similar to those illustrated and described in the assignee's U.S. Pat. No. 5,212,647 which is incorporated herein by specific reference thereto. In like manner, the disclosure and drawings of U.S. Pat. Nos. 4,555,968 and 4,697,485 are incorporated herein by specific reference thereto.

Die cutting press 10 has a horizontal base platen 12 carried by supporting structure 14 which nominally rests on a floor surface. A floating bolster 16 is rotatably and shiftably carried by base platen 12 through the use of air bearings as disclosed in connections with the referenced '968, '485 and '647 patents. A box-shaped support frame 18 is carried by the upper surface of bolster 16 and in turn supports the lower die plate 20 of a two-section die unit broadly designated 22 having a lower sections 23 supported on and carried by the bolster 16, and an upper section 25 which is reciprocable with respect to lower section 23.

A ram assembly 24 overlying the die unit 22 and associated bolster structure 16 has a hydraulically-powered ram (not shown) operably coupled to a main operating member 27 connected to the upper die plate 26 of die unit section 25 through intermediate spacers 29. Operation of the ram reciprocates the upper section 25 of die unit 22 relative to the lower section 23 thereof. Four upright posts 28 carried by base platen 12 and extending upwardly into ram assembly 24 guide the upper die section 25 when the hydraulic ram is operated.

Figure 9:
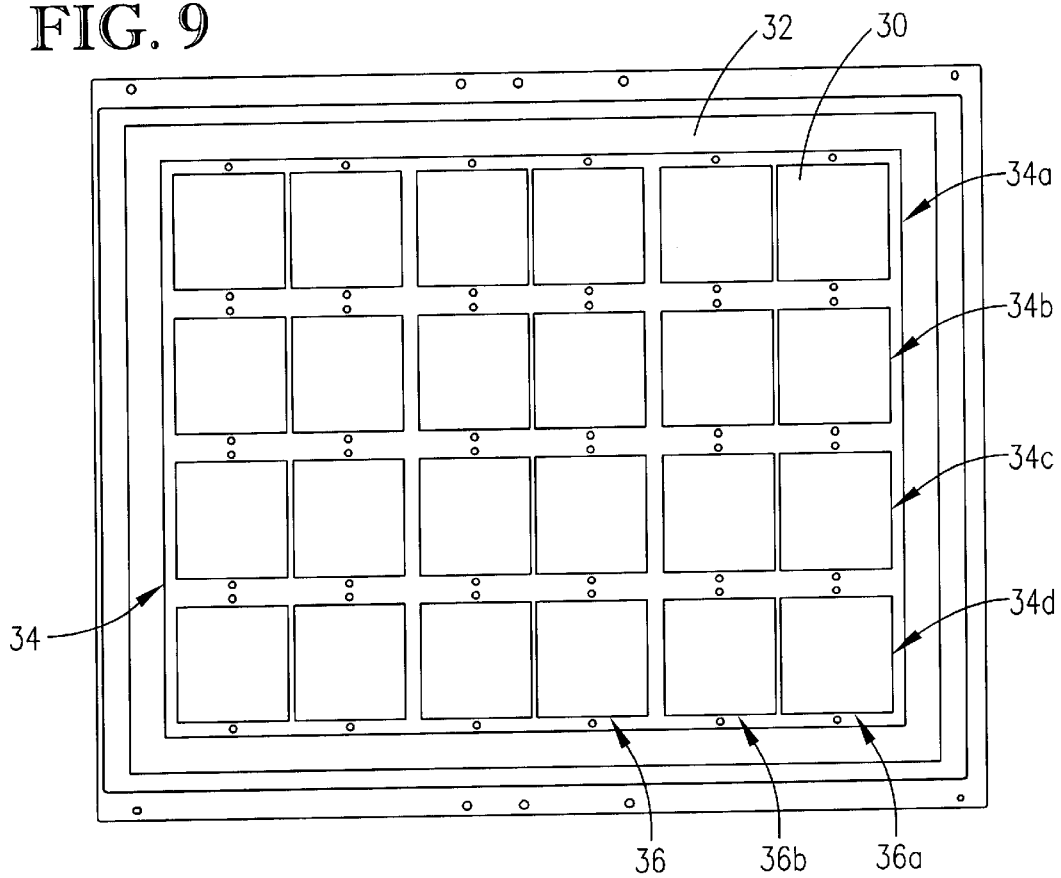
FIG. 9 is a plan view of a frame for supporting individual multi-part sheets which may be processed using the die cutting press of this invention, and illustrating the part sheet in position within the frame.
Figure 10:
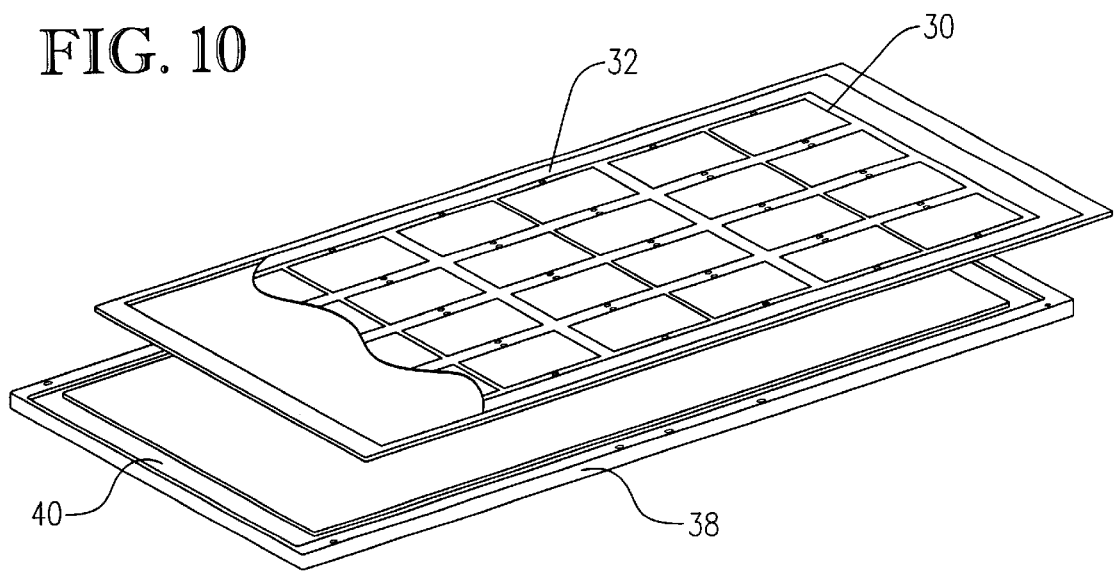
FIG. 10 is a perspective, exploded view of the frame and multi-part sheet as depicted in FIG. 9.

The die cutting press 10 as illustrated in FIGS. 1–8 is especially adapted for cutting out parts 30 from a rectangular sheet 32 having longitudinally extending, parallel rows 34 of parts, extending the length of sheet 32. The parts 30 are also arranged in cross-rows 36. Viewing FIGS. 9 and 10, sheet 32 has a series of parts arranged to present four rows of parts 34a, 34b, 34c and 34d extending longitudinally of the sheet 30. These four rows of parts also define the cross-rows 36 with the row 36a, for example, being adjacent to and parallel with the cross-row 36b. It is to be understood in this respect that the number of parts in aparticular substrate or sheet will vary from job to job. However, die cutting press 10 is specifically designed to process sheets or webs having more than one row of parts to be cut extending longitudinally of the sheet in the X axis direction of feed of the sheet or web to the die cutting press.

In the case of a sheet 32 which is represented by a number of electronic circuit boards presenting defined areas to be cut from the overall sheet, it has been found desirable to provide a rectangular frame 38 for receiving and supporting each individual electronic circuit part sheet. To that end, it can been seen from FIGS. 9 and 10 that the frame 38 preferably is provided with an internal shelf portion 40 dimensioned to engage and support the marginal edges of sheet 32.

Sheet delivery structure 42 is provided for supporting and feeding individual frames 38 with associated parts-defining sheet conveyor structure along the X axis toward and into the cutting station of die unit 22. The delivery unit 42 is constructed and configured to handle sheets, with or without a supporting frame. Alternatively power-driven infeed and up-take units may be provided for delivering a web having a series of areas defining parts to be cut from the sheet, to the die cutting station.

The sheet delivery structure 42 is essentially of conventional construction and therefore need not be described in detail. Broadly, the sheet delivery structure 42 comprises a horizontal conveyor 44 having spaced upright side members 46 and 48 each of which support chain and sprocket mechanism 50 driven by motor 52 operably connected to sprocket drive shaft 54 of mechanism 50 at the output end of the conveyor (see FIG. 4). The side members 46 and 48 are spaced apart a distance to support frames 38 thereon as is also evidence from FIG. 4. The motor 52 is connected to the controller for die cutting press 10 in a manner to cause motor 52 to be intermittently operated for time periods to bring cross-rows 36 of parts 30 into successive alignment with the cutting die 56 of die unit 22. Although a chain conveyor is illustrated in the preferred embodiment ofthe invention as depicted in the drawings, it is to be understood that other types of conveyors may be substituted for the chains and associated drive units. In the case of a web containing multiple parts 30 to be cut in die cutting press 10, infeed and take-up rollers on opposite sides of the press housing may be employed in place of the chain drive illustrated to incrementally direct the cross-rows of parts in the web to be brought into alignment with the cutting die 56. The take-up roller is generally provided with a drive roller therefor and friction mechanism is connected to the infeed roller to assure that the stretch of the web between the infeed and take-up rollers that passes beneath the die cutting die 56 always remains taut and essentially flat at all times, as is well known to those skilled in this art.

Figure 2:
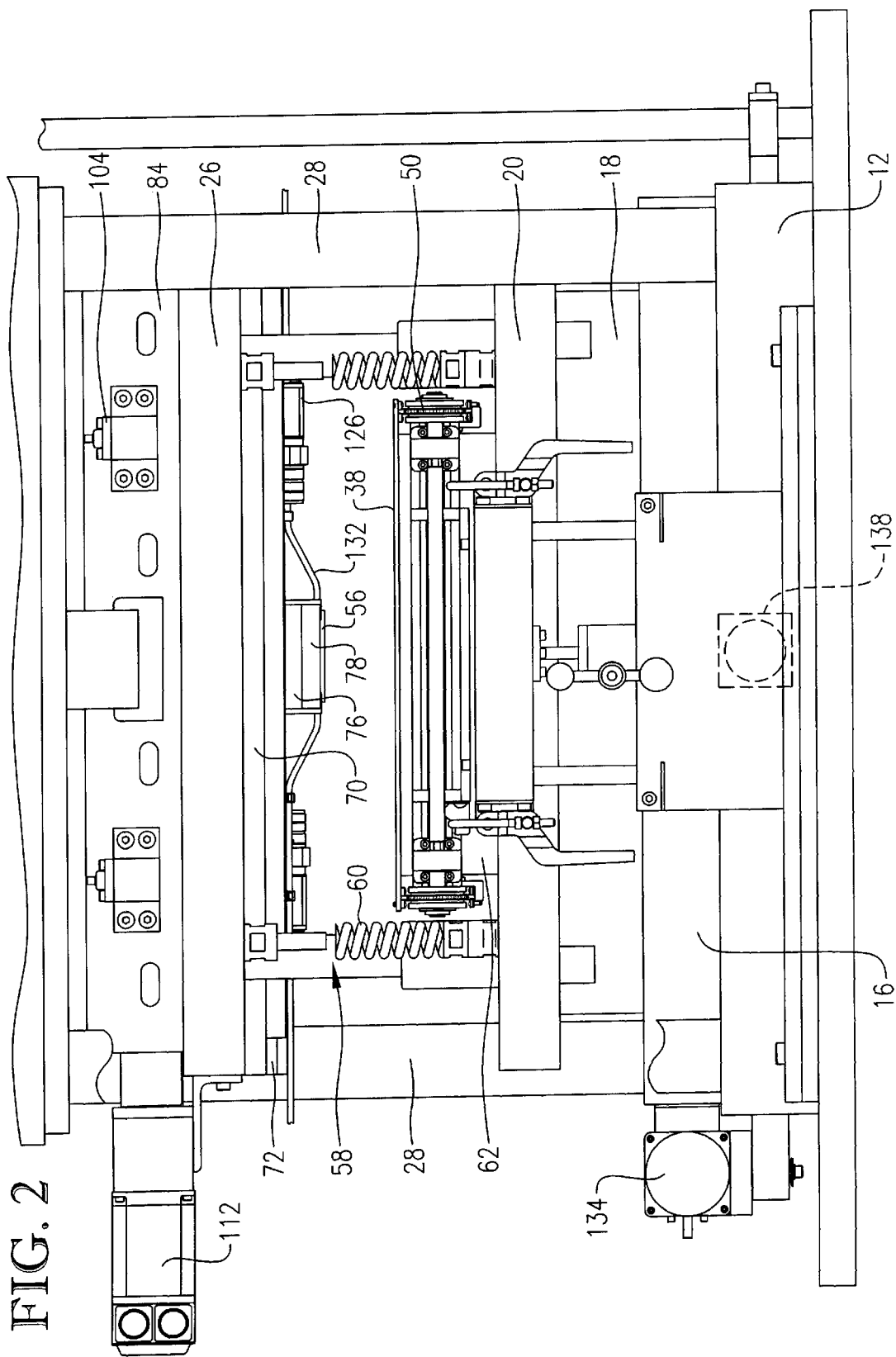
FIG. 2 is a fragmentary, end elevational view of the die cutting press as shown in FIG. 1 and taken substantially on the sight line 2—2 of FIG. 1 and looking in the direction of the arrows.
Figure 3:
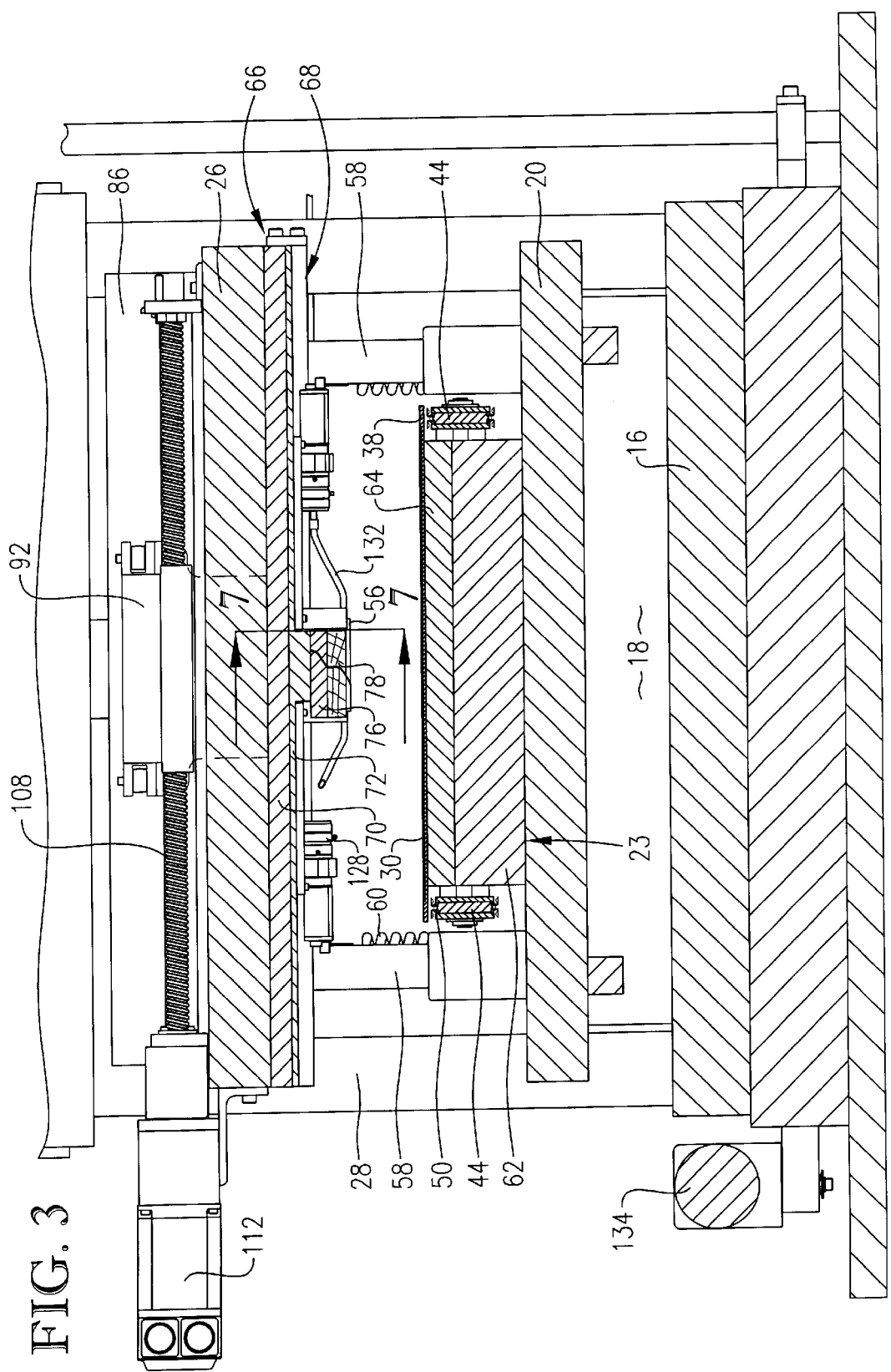
FIG. 3 is a fragmentary, vertical, cross-sectional view of the die cutting press and taken on the line 3—3 of FIG. 1 in the direction of the arrows.

As best shown in FIGS. 2 and 3, the die unit 22, which includes the lower die plate 20 and the upper die plate 26, has four guide rod units 58 at the corners thereof, which serve to guide upper die section 25 and the structure forming a part thereof, with respect to lower die section 23 as the upper die section 25 is reciprocated by the ram of assembly 24. A coil spring assembly 60 adjacent each of the guide rod units 58 fuction to bias upper die section 25 away from the lower die section 23.

As shown in FIG. 3, a die backup member 62 is supported on the lower die plate 20, while a support 64 for each of the frames 38 overlies and is carried by the backup member 62. It is to be observed from FIG. 3 that the conveyor 44 passes between two opposed guide rods 58 and their associated coil springs 60.

Figure 5:
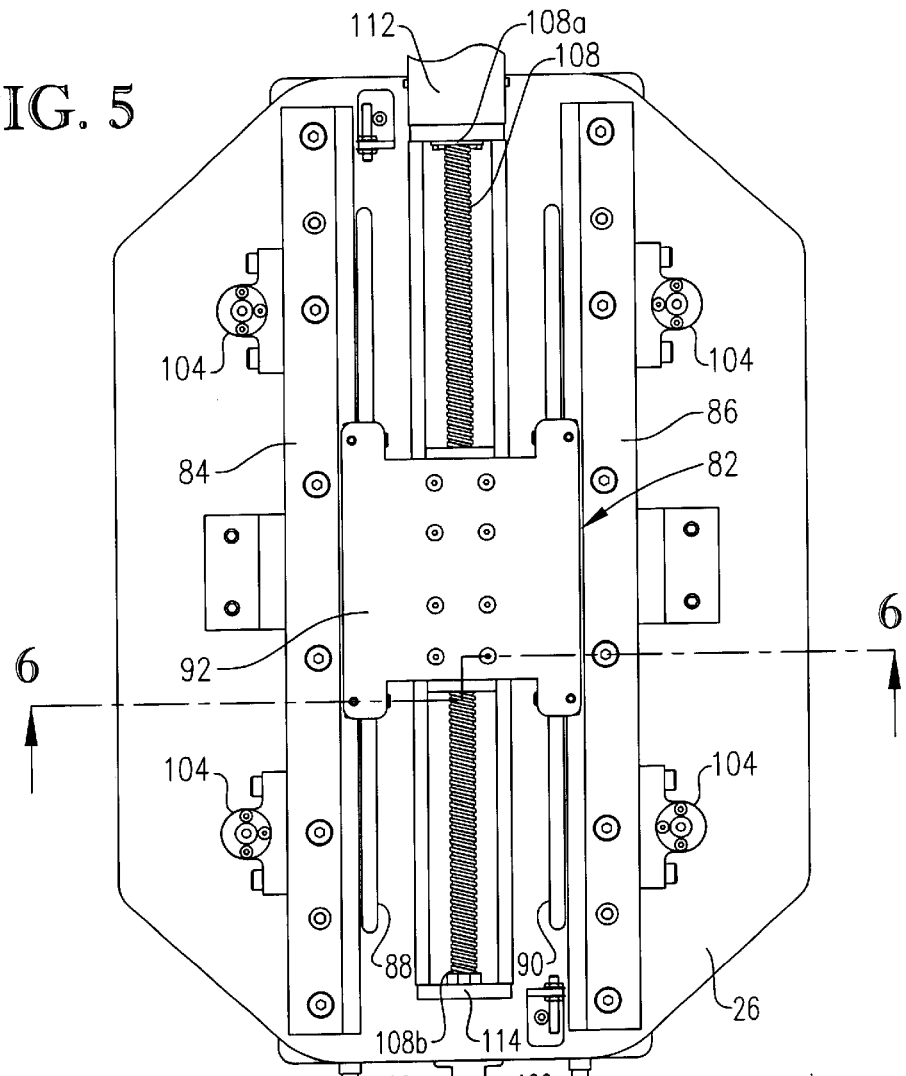
FIG. 5 is a fragmentary, horizontal, cross-sectional view on the line 5—5 of FIG. 1 and also looking downwardly.
Figure 6:
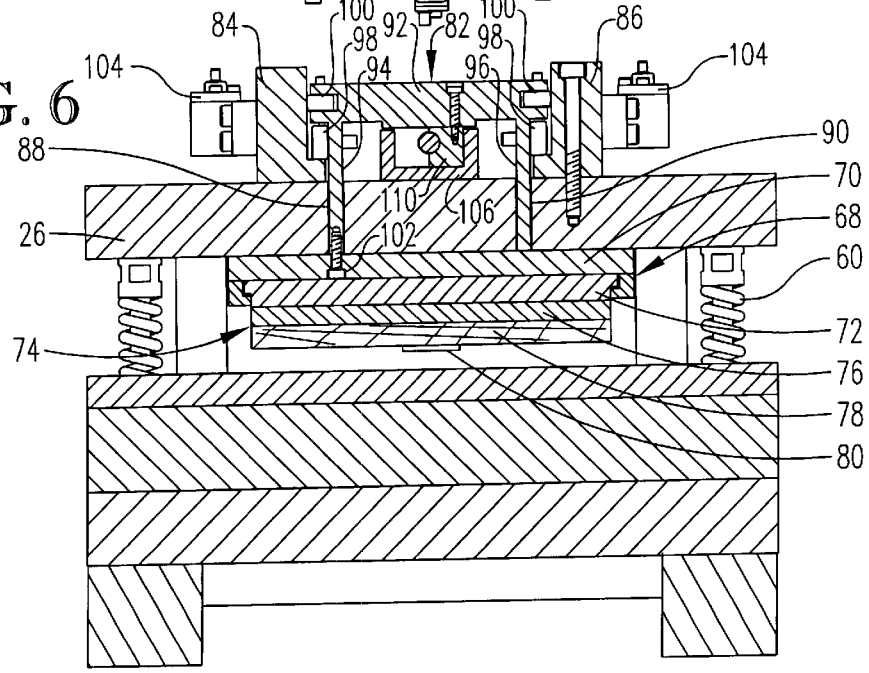
FIG. 6 is a fragmentary, vertical, cross-sectional view substantially on the irregular line 6—6 of FIG. 5 and looking in the direction of the arrows.
Figure 8:
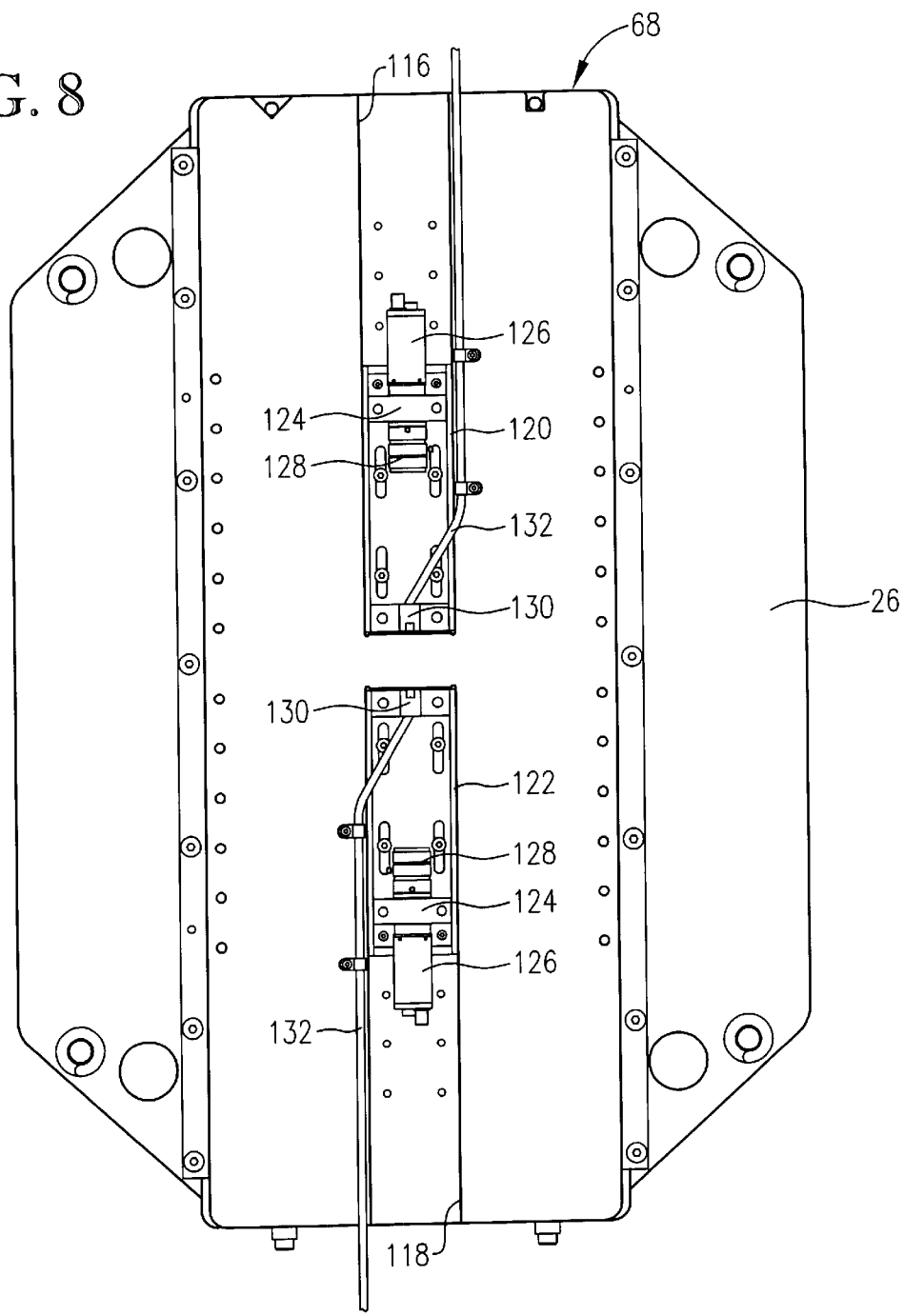
FIG. 8 is a bottom view, looking upwardly, of the indexing device portion of the die cutting press.
Figure 7:
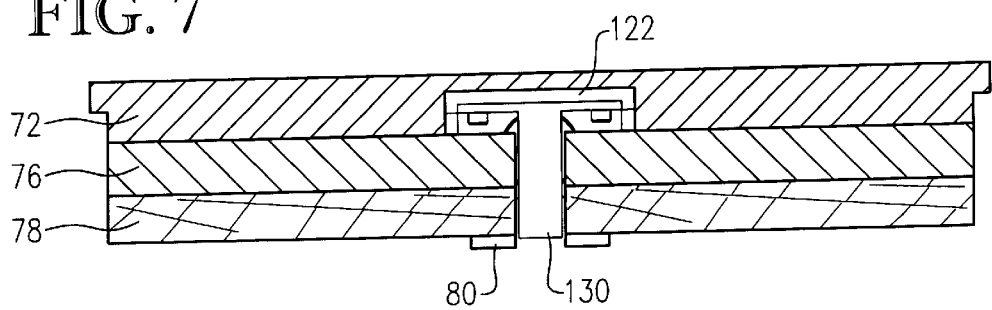
FIG. 7 is a fragmentary, vertical, cross-sectional view through the die unit of the die cutting press and taken substantially on the line 7—7 of FIG. 3 and looking in the direction of the arrows.

Die unit indexing mechanism in the nature of an indexing device 66 is carried beneath and supported by upper die plate 26. Device 66 includes a horizontal plate assembly 68 which is mounted for horizontal reciprocal movement beneath plate 26 as best shown in FIGS. 5 and 6. Viewing FIG. 6, it can be seen that the assembly 68 includes an upper horizontal plate 70 which carries a lower die plate 72. The cutting die assembly 74 secured to the underside of die plate 72 includes a plate 76, which may for example support an H-shaped wooden member 78 that receives a metal rule die 80. The provision of a rule die as shown in the drawings and referred to above is for illustrative purposes only, and it is to be understood that any one of various types of dies may be incorporated in the upper die section 25, depending upon the die cutting operation to be performed on the relatively thin substrate material.

The plate assembly 68 is slidably mounted beneath upper die plate 26 by a slide unit broadly designated 82. A pair of elongated, spaced, parallel L-shaped members 84 and 86 bolted to the upper surface of die plate 26 and located outboard of respective elongated slots 88 and 90 extending through plate 26 support an H-shaped slide plate 92 having integral depending fins 94 and 96 slidably received in respective slots 88 and 90. The slide plate 92 mounts four rollers 98 rotatable about horizontal axes and resting on the in-turn lip portions of respective members 84 and 86, and four rollers 100 rotatable on vertical axes which ride against opposed inboard, upright surfaces of members 84 and 86. Each of the rollers 100 is mounted directly above a respective roller 98. Bolts 102 serve to secure fins 94 and 96 to plate 70 which directly underlies the upper die plate 26. Gas powered dampeners 104 are mounted on respective members 84 and 86 to prevent bounce re-strikes of the die 56 when it cuts through the sheet 32 resting on support 64.

A channel 106 mounted beneath the lower surface of slide member 92 in disposition with the channel portion thereof facing upwardly receives an elongated screw 108 which passes through threaded block 110 affixed to the inner surface of channel 106. As shown in FIG. 5, the end 108a of screw 108 is operable connected to the output shaft of power unit such as a servo motor 112 which is operable to rotate the screw 108. The opposite end 108b of screw 108 is rotatably carried by a crosspiece 114 extending between opposed upright legs of channel 106.

Returning to FIG. 8, it is to be seen that the underside of the slide plate assembly made up of plates 70 and 72, has two elongated, end-to-end grooves 116 and 118 extending longitudinally of the plates and which serve to slidably mount channel members 120 and 122 respectively. Each of the channel members 122 and 124 which is adjustably secured within corresponding grooves 116, and 118 has a cross-member 124 which serve to mount a CCD camera 126. From FIG. 8, it is to be observed that the lens portion 128 of each camera is directed toward one another and thereby toward the center of plate assembly 68. Prism units 130 are mounted at the inboard ends of each of the channels 120 and 122. Fiberoptic cables 132 are connected to each of the prism units 130 to direct light beams from a light source into each of the prisms 130. Each prism is of two-part construction such that one part of the prism directs light from a respective fiberoptic cable 132 downwardly toward the underlying sheet 32 to illuminate the indicium or indicia associated with a respective part of sheet 32 generally aligned with the die 56. The other section of the prism allows the camera to view the illuminated indicium or indicia and generate electrical signals in the form of data representative of the location of that indicium or the indicia. An exemplary prism construction is shown and described in the '647 patent.

Figure 4:
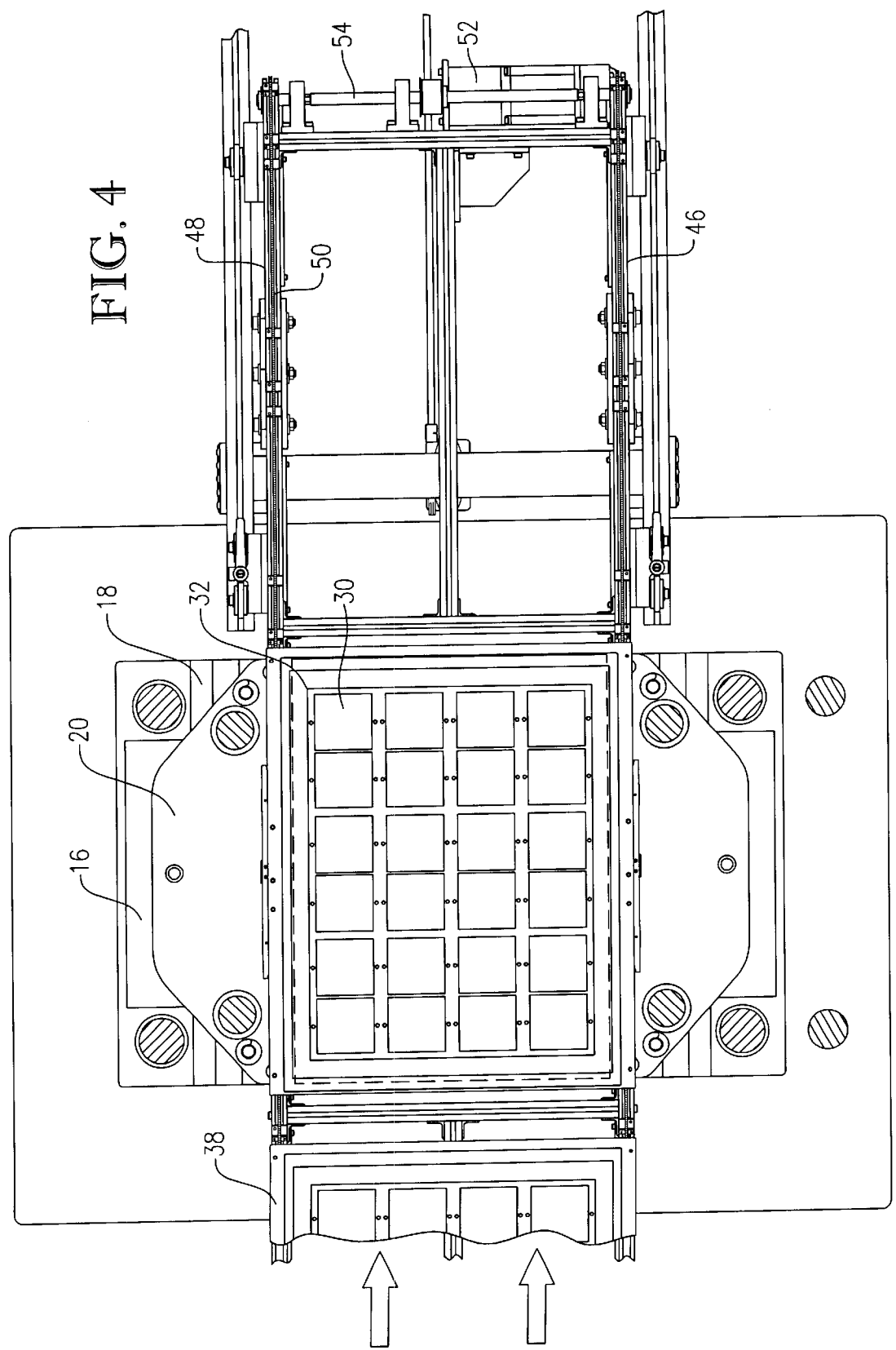
FIG. 4 is a fragmentary, horizontal, cross-sectional view on the irregular line 4—4 of FIG. 1 and looking downwardly as indicated by the arrows.
Figure 11:
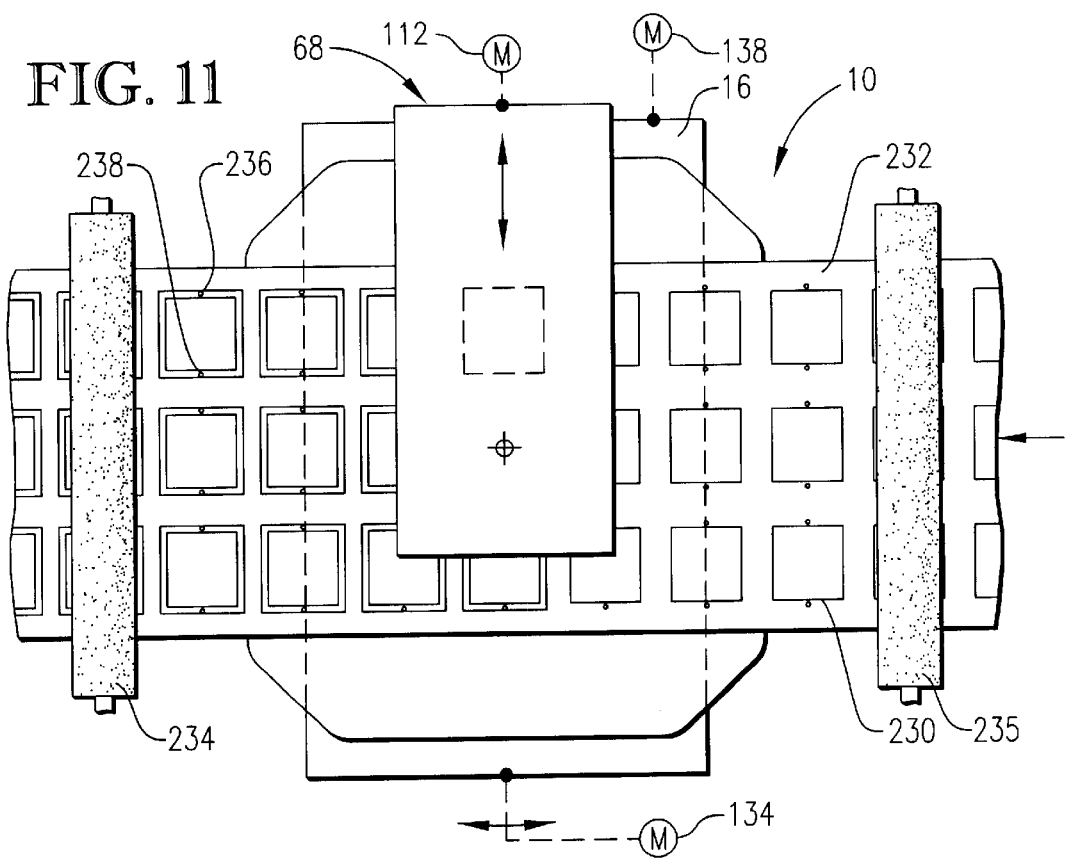
FIG. 11 is a fragmentary, essentially schematic representation of the die cutting portion of the press illustrating infeed and take-up mechanism for a multi-part web, the floating bolster supporting the die unit, and a part of the die unit indexing mechanism for moving the die unit laterally of the web.

A power unit such as servo motor 134 is connected to bolster 16, as shown in FIGS. 2, 3 and 11, for rotating the latter about a vertical pivot axis designated by the numeral 136 in FIG. 11 to provide θ angle adjustment of the bolster 16. Another power unit such as servo motor 138 (designated schematically in FIG. 11) provides fine Y axis adjustment of bolster 16 for final registration of the die with the part to be cut. The construction, operation and disposition of the Y axis adjustment servo 138 is illustrated in FIGS. 1 and 4 of the '968 patent incorporated herein by reference thereto, and described in detail in that patent.

FIG. 11 is a schematic representation of certain of the operating components of die cutting press 10 for cutting parts 230 of a relatively thin web 232. To that end, a take-up roller 234 is shown schematically in FIG. 11, while a infeed roller 236 is also shown schematically. The rollers 236 and 234 are representative of a conventional infeed and take-up system as for example shown in FIG. 1 of the '647 patent. It is to be understood though that a sheet fed delivery system may be provided as a replacement for web feed as schematically represented in FIG. 11, along with supporting trays or frames such as the frames 38 shown in FIGS. 9 and 10 hereof, and carried by a conveyor of the type depicted in FIGS. 1 and 2.

In FIG. 11, the schematically represented plate assembly 68 is indexed laterally of web 232 by the servo motor 112. Fine adjustment of bolster 16 is carried out by the centrally located servo motor 138. Servo motor 134 functions to accomplish θ angle adjustment of bolster 16 about pivot axis 136. The die 56 is represented by the dashed rectangle in FIG. 11.

As previously noted, die cutting press 10 is especially adapted for die cutting of parts from a relatively thin sheet of material that is susceptible to deformation and warpage as a consequence of the manufacturing process. Examples of products of this type are flexible electronic circuit boards having copper conductive areas arranged in a predetermined pattern on a non-conductive support such as a polyimide resin. Other resin types include phenolic, polyester-polyimide laminates, polyurethane, polyethylene, metalized polycarbonate and polyesters. Typically, sheets of this nature are from about 0.001 in. to about 0.015 in. in thickness. Die cutting of each of the parts 30 and 230 from the sheet 32 and web 232 respectively using die cutting press 10 can be maintained within an overall accuracy of about ±0.001 in. Cutting depth accuracy can also be maintained to about ±0.0005 in.

In operation, and referring to the depiction of the die cutting press as set out in FIGS. 1–10, a series of frames 38 each containing a sheet 32 are placed on the chain support of conveyor 44. The motor 52 is operated for a time to bring a cross-row 36 of parts 30 on sheet 32 into general alignment with the cutting die 56 of die unit 22. In FIG. 11, it is to be observed that the schematically depicted die 56 is aligned with one of the parts 230 of the row of parts 236 extending across the width of the web 232. Motor 52 therefore controls infeed of the lateral row of parts to general alignment with the cutting die. As soon as the sheet 32 or web 232 has been advanced into a position or the part 30 or 230 to be cut is generally aligned with the die 56, precise registration of the die with the part is carried out.

The cameras 126 obtain a visual image of the indicia 236 and 238 in the case of web 232, and similar indicia in the instance of sheet 32, located on opposite sides of a part 30 or 230 to be cut from the web or sheet. The CCD array of the camera generates electrical signals as data indicating the location of the indicia in the field of vision of the camera. It is notable in this respect that the light rays directed onto the upper surface of the sheet 32 or web 232, in the vicinity of the indicia on opposite sides of the part to be cut, illuminate the indicia so that the camera has a clear view of the location of the indicia.

The electrical signals from cameras 126 are directed to a computer for microprocessor control of servos 134 and 138 as well as motor 52 or take-up rollers 234 and 235 where a web is being processed by the die cutting press. The manner in which the data from cameras 126 is processed by the computer and compared using a comparator with data stored in the computer representative of the desired location of the part to be cut with respect to the cutting die, is described in detail in the '647 patent, which again is specifically incorporated herein by reference thereto. The motor 52 or the operator for take-up roller 234 and 235 may therefore be operated for a time interval to obtain precise X axis registration of the part 30 or 230 with the die 56, simultaneously with required rotation of the bolster 16 by servo 134 for precise θ angle registration, and operation of servo 138 as required to obtain precise Y axis registration of the die 56 with the part to be cut.

Upon completion of cutting of the part 30 or 230 from sheet 30 or web 232 in the first longitudinally extending row of parts, servo 112 is operated for a time interval to shift the die 56 into general alignment with the part 30 or 232 in the next adjacent row of parts. Operation of servo effects rotation of screw 108 which causes the slide unit 82 to be moved laterally of the upper die plate 26. Rollers 98 and 100 on the slide unit 82 provide for precision lateral shifting of the plate assembly 68 carried by slide unit 82. The duration of operation of servo 112 is controlled by the individual programming the computer controller of die cutting press 10. A desired displacement value for each indexed movement of the slide unit 82 is manually entered into the computer program depending upon the lateral spacing of the parts to be cut one from another.

As soon as the die 56 has been indexed to the next adjacent laterally positioned part to be cut, fine registration of the die 56 with the part is carried out by simultaneous X, Y and θ adjustments as previously described. It has been determined that the die cutting press 10 may be operated at approximately one to two seconds per cycle with each cycle including one index of the substrate, one cutting cycle, and one X, Y, θ registration. Fine registration time is the greatest variable in cycle rate, which is dependent on the magnitude of the image location error detected resulting from deformation and warpage of the substrate, and the level of precision required. Thus, for a single panel or web, the cutting station process time may be eight seconds where four lateral indexes of die 56 are required to as much as sixteen seconds for eight lateral die indexes.

Figure 13:
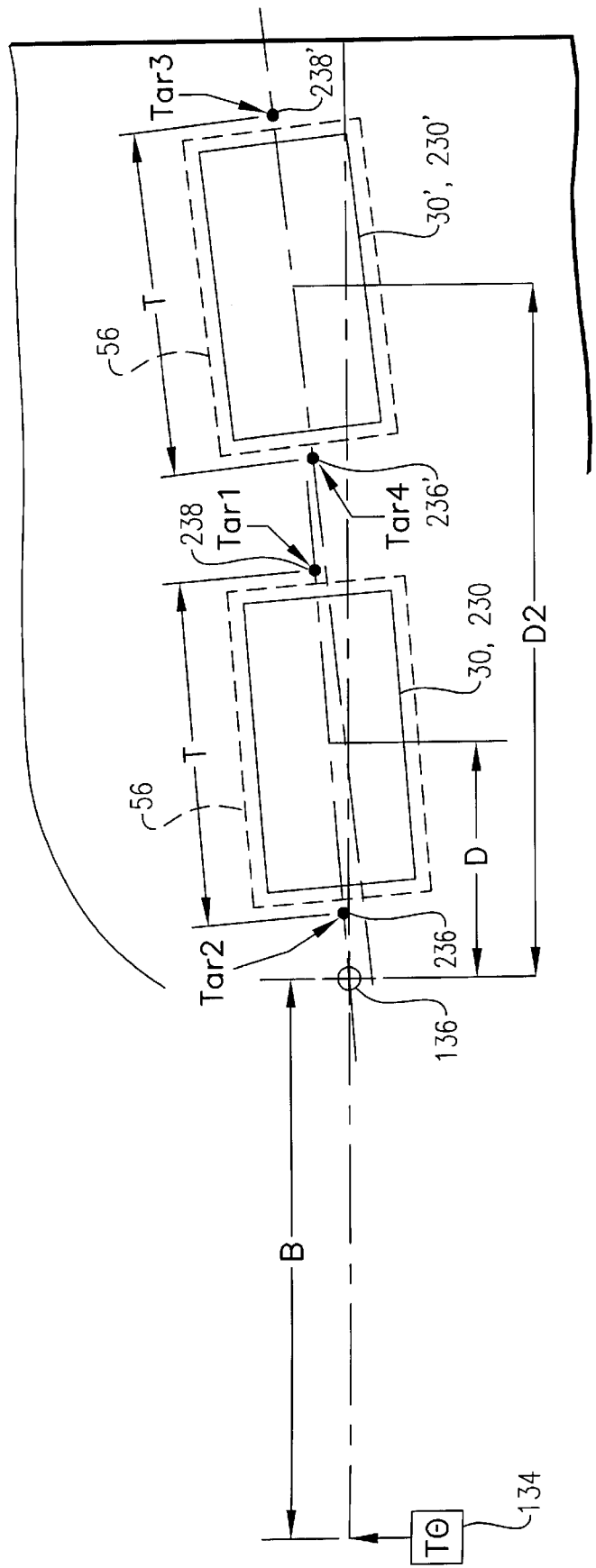
FIG. 13 is a schematic depiction of the way in which the die unit is brought into precise alignment with each part to be cut from the web or sheet by aligning the die unit with a respective part based on the distance of each part to be cut from the axis of rotation of the bolster.

FIG. 13 schematically illustrates a major problem that arises when the die unit 22 is indexed across the width of a sheet or web for successive cutting of parts from a lateral row of parts, and precise registration of the die is required with each part where the substrate has been deformed or become warped as a result of the manufacturing process therefor. In FIG. 13, the pivot axis for the bolster is indicated by the numeral 136. The outline of a part 30 or 230 and the next adjacent part 30' and 230' are indicated by full lines. The outline of the die 56 is represented by dash lines presenting a rectangle. The indicia 236 and 238 for the part 230 (and which would be same relative orientation for a part 30), are designated as "Tar1" (target 1) and "Tar2," while the indicia 236' and 238' for part 30' and part 230' are designated as "Tar3" and "Tar4." Servo 134 which rotates bolster 16 about pivot axis 136 is designated as "Tθ." The distance between Tθ and the pivot axis of the bolster is identified as "B." "D" represents the distance between the center of the part 30, 230 and the pivot axis 136 at the time when die 56 is brought into initial general alignment with the part 30, 230, while "D2" represents the distance between the center of part 30', 230' and pivot axis 136 when die 56 is brought into initial general alignment with the next adjacent part 30', 230'. "T" is the distance between Tar1 and Tar2, as well as the distance between Tar3 and Tar4.

Compensation must be provided for the fact that the die 56 and its supporting upper movable structure must be moved through a different angle and a different distance to bring the die into precise registration with part 30', 230' than is the case when die 56 is moved to bring the die into precise registration with part 30, 230 because part 30, 230, as an example, is spaced from the pivot axis 136 of bolster 16 a different distance than the spacing of part 30', 230' from that pivot axis during indexed movement of the die 56 into successive overlying relationship with a row of parts across the width of the sheet 32 or web 232.

The required compensation is accomplished by programming the computer control for the servos 134 and 138 and motor 52 to distinguish between the relative locations of the parts to be cut and the pivot axis of bolster 16, and to vary the operation of the servos and the motor 52 to accommodate that difference. The compensation is carried out by providing values in the computer program representative of:

B=Distance between Tθ servo 134 and pivot point 136
D=Distance between current position of die 56 and the pivot point 136
T=Distance between Tar1 and Tar2
Δθ=θ axis angle error
$\Delta T_x$=Tθ correction for Δθ
ΔX=X axis error correction
ΔY=Y axis error correction
ΔX1 =Tar1 X physical error
ΔX2 =Tar2 X physical error
ΔY1 =Tar1 Y physical error
ΔY2=Tar2 Y physical error With these values entered, the program then calculates the registration adjustment that must be made by servos 134, 138 and motor 52 (or take-up roller 234) in accordance with the following formulas and calculations:

Where $$\Delta X_+ = \Delta X1 + \Delta X2 \qquad (1)$$

$$\Delta X_- = \Delta X1 - \Delta X2 \qquad (2)$$

$$\Delta Y_+ = \Delta Y1 + \Delta Y2 \qquad (3)$$

then,

| | |
|---|---|
| X error before Δθ correction $\Delta X_x = \Delta X_+/2$ | (4) |
| Y error $\Delta Y = \Delta Y_+/2$ | (5) |
| θ error $\Delta \theta = \Delta X_-/T$ | (6) |
| Since X error after Δθ correction $\Delta X_\theta = \Delta \theta \cdot D$ | (7) |

∴ overall X error:

$$\Delta X = X_x + \Delta X_x + \Delta_\theta = (\tfrac{1}{2} \Delta X_+) + (D/T)(\Delta X_-) \qquad (8)$$

also,

TΔ servo 134 correction for Δθ

$$\Delta T_x = \Delta \theta \cdot B = (B/T)(\Delta X_-) \qquad (9)$$

therefore, the X_Y_θ registration formulas are as follows:

$$\Delta X = (\tfrac{1}{2}\Delta X_+) + (D/T)(\Delta X_-) \qquad (10)$$

$$\Delta Y = \tfrac{1}{2} \Delta Y_+ \qquad (11)$$

$$\Delta Tx = (B/T)\Delta X_- \qquad (12)$$

where, $\Delta X_+$, $\Delta X_-$, $\Delta Y_+$ refer to (1), (2), (3).

After the routine above has been completed, the system is desirably programmed to repeat the routine to ensure that the registration of die 56 with the underlying part 30 or 230 to be cut is within the required tolerance range.

The need for registration compensation depending upon the distance of the part to be cut from the pivot axis 136 of bolster 16 is evident from FIG. 13, particularly in the case as shown where the part 30 is not in the same orientation with respect to a line through servo 134 and pivot point 136 as a result of deformation or warpage of the sheet or web 232. A line between Tar1 and Tar2 associated with part 30, 230 may be, as illustrated, at a different angle with respect to a line between servo 134 and bolster pivot point 136, than the line between Tar3 and Tar4 associated with part 30', 230'. The difference in angularity, as well as the difference in spacing of the parts to be cut from the pivot axis of bolster 16, means that the X, Y and θ fine adjustments for die 56 must be different in the case of part 30, 230 than the registration adjustment that must be made for part 30', 230', as a function of the distance of the part to be cut from the pivot axis 136 of bolster 16. Programming of the computer in accordance with the formulas above provides the requisite compensation for precise registration of the die 56 with successive parts in a row across the width of a sheet 32 or web 232.

Figure 12:
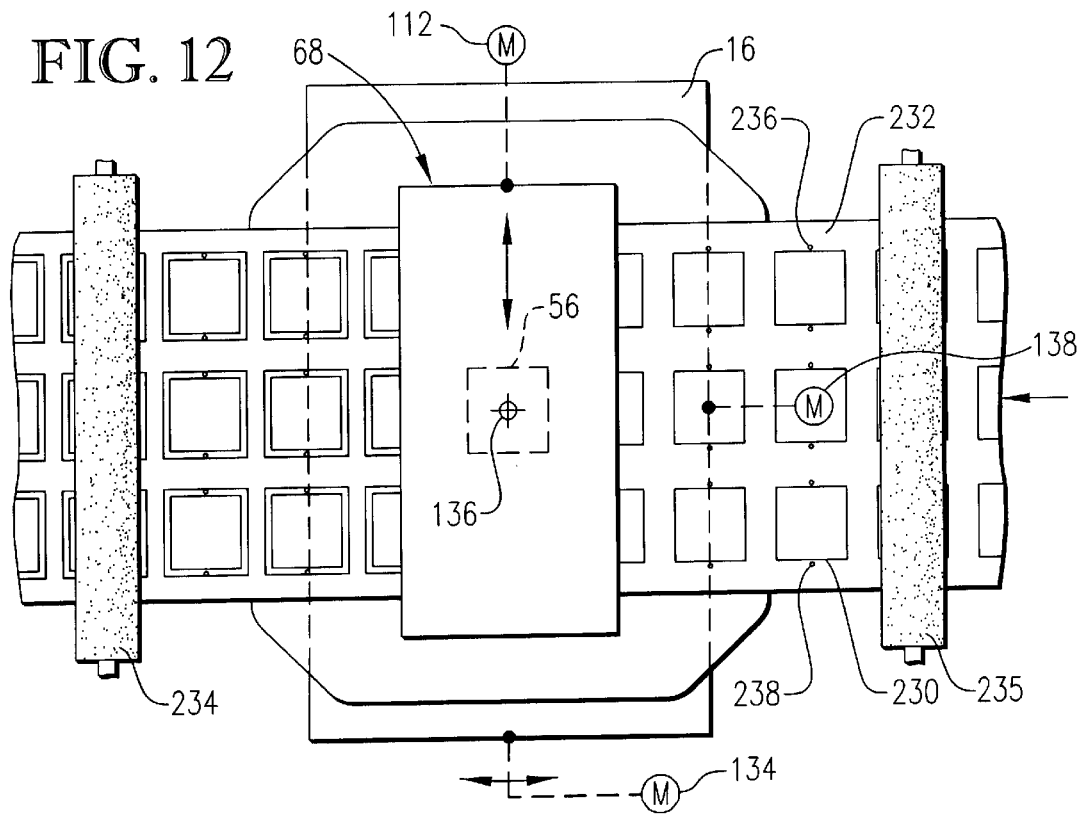
FIG. 12 is a fragmentary, schematic representation of an alternate form of the present invention in which the bolster is rotated 90° from the disposition thereof shown in FIG. 11.

In the alternate embodiment of the invention depicted schematically in FIG. 12, bolster 16 is in effect rotated 90° such that servo 138 is located on the X axis of the sheet or web to be processed. In this instance, fine adjustment of the position of the die 56 with respect to a part to be cut is carried out by the servo 138, while servo 112 serves the dual function of indexing the plate assembly 68 and thereby the die 56 across the width of the sheet or web, as well as providing for a Y axis fine adjustment. Consequently, it is necessary to move only the tooling for fine registration of the cutting die with respect to the part to be cut from the substrate, and there is no requirement for fine X axis adjustment using motor 52 in the case of a sheet, or take-up roller 234 in the instance of processing of a web. Furthermore, this alternative construction simply requires that the servo 112 be programmed for either longer shaft rotation for major indexing purposes, and to then be rotated for much shorter period of time for fine Y axis adjustment. The servo 112 can also be programmed to rotate at much faster rate during indexing than fine Y axis adjustment, if desired, to decrease the overall cycle time of the cutting process.

Figure 14:
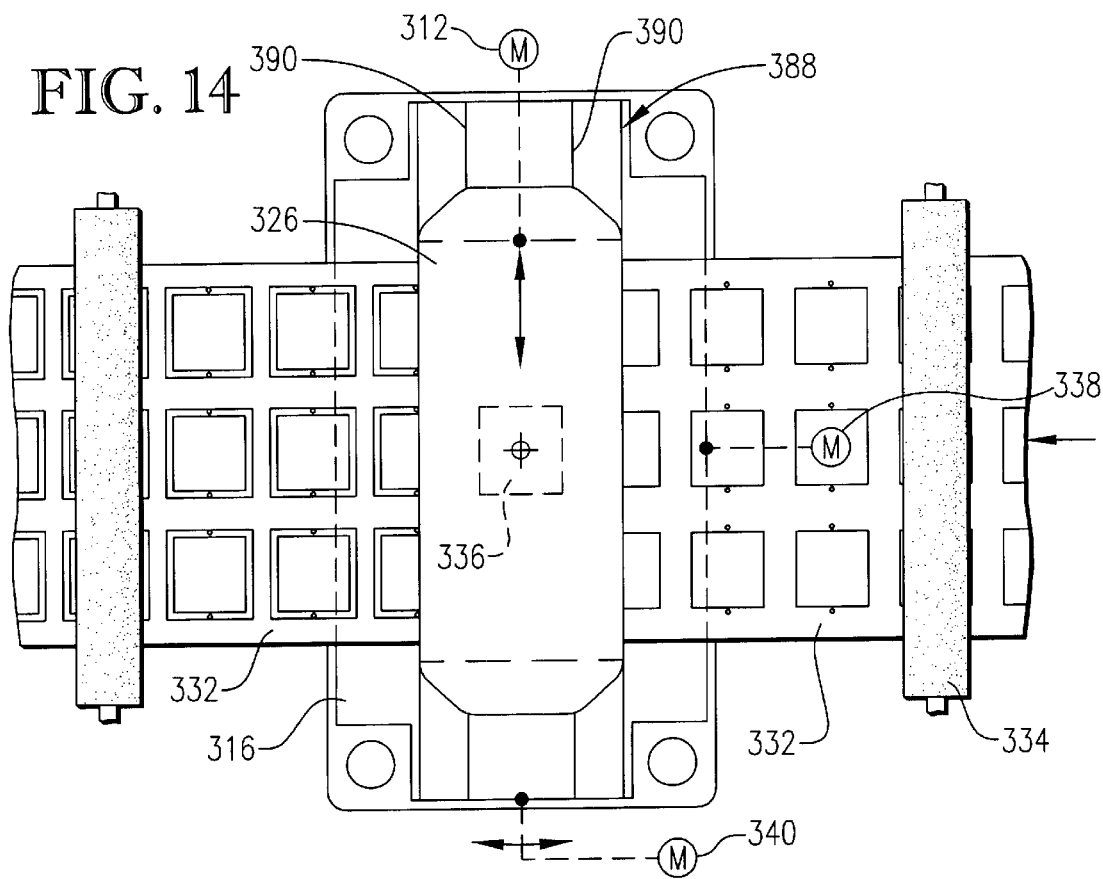
FIG. 14 is a fragmentary, schematic, plan view depiction of another alternate form of the present invention in which an indexing Y axis linear transmission device carrying the die unit is mounted directly on the bolster.
Figure 15:
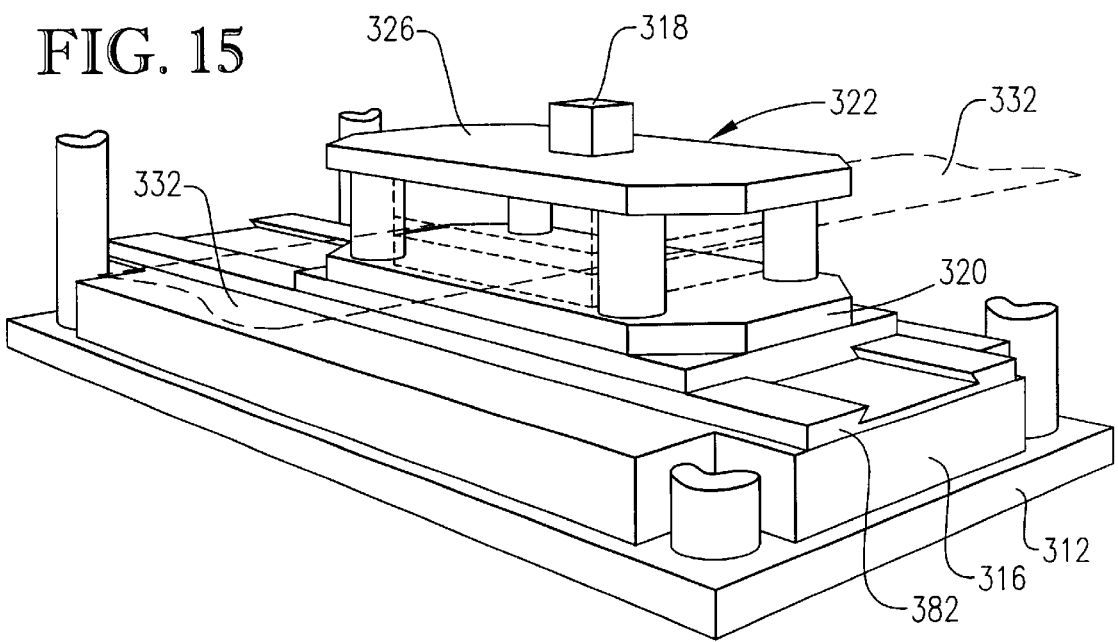
FIG. 15 is a fragmentary, schematic, perspective depiction of the alternate die cutting press as shown in FIG. 14 of the drawings.

Another alternate embodiment of the invention is depicted schematically in FIGS. 14 and 15, wherein the die cutting press 310 is provided with a floating bolster 316 mounted on a base platen 312. Bolster 316 is functionally and operationally similar to bolster 16 mounted on base platen 12 of press 10. To that end, a θ angle adjustment servo 340 is operably coupled to the bolster 316 for rotating the bolster about the pivot axis 336 of bolster 316. Likewise, servo 338 is connected to the bolster 336 for micro adjustment of the bolster 336 in the X direction of travel of the web 332. The bolster 316 is provided with track or guide structure 388 on the upper surface thereof, extending along the length of the structure as viewed in FIG. 14, which may take the form of parallel tracks 390, or a dovetail groove in the surface of the bolster. Track or guide structure 388 receives a linear translation slide device or unit 382 which is mounted for shifting movement along the length of guide or track structure 388. The unit 382 mounts the die unit 322 which has a lower die plate shown schematically and designated by the numeral 320, and an upper die plate shown schematically and designated by the numeral 326. Die unit 322 is operated by the ram 318 of the press.

A vision system (not shown) which includes two cameras and associated prisms, as well as an illumination system as previously described with respect to die press 10, is provided in association with die unit 322. The two cameras and their prisms are provided on die plate 322 in disposition such that the prisms are cantilevered over, for example, the web 332 which is directed through the space between die plates 320 and 326, as shown schematically in FIG. 15. Here again, the die components of die unit 322 are not illustrated in that the components are of conventional construction, and may for example comprise a combination die having a punch carried by upper die plate 326 and a complemental female die ring supported by lower die plate 320 below the web 332 which is directed through the die cutting station defined by die unit 322.

A combination macro and micro servo 312 is connected to the slide unit 382 for shifting the slide unit 382 along the length of track or guide structure 388. A screw drive of the type shown and described with respect to die cutting press 22 and illustrated in detail in FIGS. 3, 5 and 6, is provided for shifting the slide unit 382 linearly of the track or guide structure 388 in response to operation of servo 312.

The web 332 is initially shifted through a displacement to bring a cross-row of defined areas of the web into general alignment with the combination die of the die unit 322. Assuming that the combination die of die unit 322 is in general alignment with a defined area of the web 332 to be cut upon completion of the X axis movement of web 332, registration of the combination die with the defined area part of web 332 is accomplished by simultaneous operation of the X axis registration servo 332, θ angle adjustment servo 340 and Y axis adjustment servo 312 operating in a micro adjustment mode, to rotate and shift bolster 316 as required to precisely register the combination die with the part image of the web 332 to be cut. This registration is controlled by the computer using the programming routine previously described with respect to die cutting press 10.

Servo 312 is next operated in its macro mode to shift the slide unit 382 and thereby the die unit 322 mounted thereon through a displacement across the width of web 332 sufficient to bring the combination die into general alignment with the next adjacent part image to be cut by the die. Although reference has been made to a conventional combination die as being of the type that can be a part of die unit 322, it is to be understood in this respect that other conventional dies may be provided, as for example a steel rule die as illustrated and described with die cutting press 10.

In addition, in place of servo 338, X axis micro adjustment of web 332 may be carried out through use of the take-up roller 334 of the system which controls the movement of web 332. Similarly, a conveyor assembly may be provided similar to conveyor 44 of die cutting press 10 for delivering sheets to die press 310 for sequential cutting of image parts from the sheet as previously described. Here again, X axis fine adjustment of the sheet may be accomplished either by minute X axis shifting of the sheet as necessary, or by operation of a servo 338 connected to bolster 316.

We claim:
1. In a die cutting press for precision cutting of individual defined areas from a plurality of defined areas arranged in discrete rows both along and across a relatively thin substrate and wherein at least one die registration indicium is provided in association with each of the defined areas, said press having a base platen, a bolster shiftably mounted on the base platen and rotatable about a pivot axis, and a die unit moveable toward and away from the base platen, said die unit being supported on and movable with the bolster, improved die registration apparatus comprising:
  a substrate delivery unit operable to successively shift the substrate in order to bring an individual defined area into general alignment with the die unit;
  an indexing device connected to the die unit and operable to successively shift the die unit in a direction perpendicular to a path of travel of the substrate by said substrate delivery unit relative to the bolster into general alignment with successive ones of a plurality of defined areas presenting a discrete row of said defined areas between successive shifting of the substrate by the delivery unit; and
  die unit registration mechanism connected to the bolster operable to sense the registration indicium associated with each respective individual defined area when the die unit is in general alignment therewith, said mechanism being responsive to said sensing to rotate and shift the bolster and thereby the die unit to a required extent to bring the die unit into registration with said respective defined area to be cut by the die unit.

2. A die cutting press as set forth in claim 1, wherein said die registration mechanism includes components cooperatively operable to simultaneously rotate and shift the bolster and operate the delivery unit to an extent as required to align the die unit with the respective defined area.

3. A die cutting press as set forth in claim 1, wherein said registration mechanism is operable to rotate the bolster an amount and to shift the bolster a distance to obtain registration of the die unit with an individual defined area generally aligned with the die unit as a function of the distance of the particular individual defined area generally aligned with the die unit from the pivot axis of the bolster.

4. A die cutting press as set forth in claim 1, wherein said defined areas are arranged in a plurality of rows extending along respective first axes of the substrate and in a plurality of cross-rows extending along respective second axes of the substrate at an angle with respect to the first axes, said indexing device including a carrier for the die unit, and a shifter connected to the carrier for successively shifting the die unit into said respective alignment with the defined areas of each cross-row thereof.

5. A die cutting press as set forth in claim 1, wherein said die registration mechanism includes at least one digital camera operable to receive an image of said indicium associated with said respective defined area when the defined area is in general alignment with said die unit to generate data indicative of the position of said indicium sensed by the camera, a reference unit providing reference image data representative of the desired position of the indiciim associated with the respective defined area and thereby that defined area with respect to the die unit, a comparator for comparing the reference image data with the indicia image data from the camera, and a controller connected to the bolster and operable in response to the difference between the sensed indicium image data and the reference image data to rotate and shift the bolster as required to align the die unit with the individual defined area initially generally aligned therewith.

6. A die press as set forth in claim 5, wherein each of the defined areas has a width and said indexing device includes a support member carried by the bolster, a die unit carrier shiftably mounted on the support member, a power unit connected to the carrier operable to shift the carrier and thereby the die unit thereon to an extent generally equal to the width of each of the individual defined areas to be cut from the substrate, and wherein said digital camera is connected to the carrier for movement with the latter with respect to the bolster.

7. A die press as set forth in claim 1, wherein is included a shiftable carrier supporting the die unit on the bolster, and a power unit connected to the carrier for shifting the latter, said power unit including an elongated rotatable screw element coupled to the carrier and a servo unit operably connected to the screw element for rotating the latter to shift the carrier and thereby the die unit.

8. A die cutting press as set forth in claim 5, wherein two die registration indicia are provided in association with each of the defined areas of the substrate and the substrate delivery unit is operable to shift the substrate along an X axis of the substrate, and wherein a θ angle operator is connected to the bolster for rotating the bolster about said pivot axis and a Y axis operator is connected to the bolster for shifting the bolster along a Y axis perpendicular to said X axis, said comparator initially determining the distance between said θ angle operator and the pivot axis of the bolster, the distance between the center point of the die unit and the pivot point of the bolster, the distance between the pair of indicia associated with each defined area of the substrate, and the angle between an imaginary line through the pair of indicia of said respective defined area and an imaginary line between the θ angle operator and the pivot axis of the bolster, said comparator thereafter actuating the Y axis operator and the θ angle operator based on said determinations to shift and rotate the bolster as required to bring the die unit into registration with said respective defined area to be cut by the die unit.

9. A die cutting press as set forth in claim 8, wherein said comparator initially determines the relationship of the two indicia associated with said respective defined area with respect to the reference image data representative of the desired position of the indicia along said X axis, said comparator thereafter actuating the substrate delivery unit to move the substrate to an extent required to bring the respective defined area into desired alignment with the die unit along the X axis.

10. A die cutting press as set forth in claim 9, wherein said comparator actuates the θ angle operator, the Y axis operator and the substrate delivery unit simultaneously as required to bring the respective defined area into precise alignment with the die unit.

11. A die cutting press as set forth in claim 10, wherein said comparator actuates the θ angle operator, the Y axis operator and the substrate delivery unit to bring the respective defined area into precise alignment with the die unit based on the distance ofthe respective defined area to be cut by the die unit, from the pivot point of the bolster.

12. A die cutting press as set forth in claim 1, wherein said defined areas of the substrate are arranged in rows extending in one direction of the substrate and in a second direction of the substrate generally parallel to said one direction, said delivery unit and the indexing device operating to shift the die unit in said one direction until all of the defined areas presenting a row thereof are cut by the die unit, and to then shift the die unit in said second direction until all of the defined areas presenting another row thereof are cut by the die unit.

13. A die cutting press as set forth in claim 12, wherein said delivery unit and the indexing device operate to shift the die unit in said one direction and then oppositely in said second direction along substantially serpentine paths.

14. A die press as set forth in claim 1, wherein said indexing device is provided with a carrier for the die unit operable to successively shift the die unit in a direction generally at right angles to the direction of shifting of the substrate by said delivery unit.

15. A die press as set forth in claim 1, wherein each of the defined areas has a width and said indexing device includes a support member carried by the bolster, a die unit carrier shiftably mounted on the support member, and a power unit connected to the carrier operable to shift the carrier and thereby the die unit thereon to an extent generally equal to the width of each of the individual defined areas to be cut from the substrate.

16. A die cutting press for precision cutting of individual defined areas from a plurality ofdefined areas of a relatively thin substrate susceptible to deformation and warpage during its manufacture and wherein at least one die registration indicium is provided in association with each of the defined areas, said defined areas being arranged in a plurality of rows extending along respective first axes ofthe substrate and in a plurality of cross-rows extending along respective second axes of the substrate at an angle with respect to the first axes, said press comprising:

a base platen;

a bolster shiftably mounted on the base platen and rotatable about a pivot axis;

a die unit supported on and movable with the bolster, said die unit being moveable toward and away from the base platen;

a substrate delivery unit operable to successively shift the substrate in order to bring each cross-row of individual defined areas into general alignment with the die unit;

an indexing device connected to the die unit and operable to successively shift the die unit in a direction perpendicular to a path of travel of the substrate by said substate delivery unit relative to the bolster into general alignment with successive ones of a plurality of said defined areas in said cross-rows thereof between successive shifting, of the substrate by the delivery unit; and die unit registration mechanism connected to the bolster operable to sense the registration indicium associated with each respective individual defined area when the die unit is in general alignment therewith, said mechanism being responsive to said sensing to rotate and shift the bolster and thereby the die unit to a required extent to bring the die unit into registration with a respective defined area to be cut by the die unit.

17. A die cutting press as set forth in claim 16, wherein is provided power units connected to said bolster for simultaneously rotating the bolster about said pivot axis thereof through a θ angle and for shifting the bolster in an X direction of travel of the substrate and in a Y direction transverse of the direction of travel of the substrate, through displacements sufficient only to bring the die unit into precise alignment with an individual defined area which has initially been brought into general alignment with the die unit.

18. In a die cutting press for precision cutting of individual defined areas from a plurality of defined areas arranged in discrete rows both along and across a relatively thin substrate and wherein at least one die registration indicium is provided in association with each of the defined areas, said press having a base platen, a bolster shifably mounted on the base platen and rotatable about a pivot axis, and a die unit moveable toward and away from the base platen, said die unit being supported on and movable with the bolster, improved die registration apparatus comprising:

a substrate delivery unit operable to successively shift the substrate in order to bring an individual defined area into general alignment with the die unit;

an indexing device shiftably supported directly above and movable with the bolster, said indexing device also being shiftable horizontally relative to the bolster in a direction in a direction perpendicular to a path of travel of the substrate by said substrate delivery unit into general alignment with the die unit, said indexing device carrying the die unit thereon and operable to successively shift the die unit in a direction perpendicular to said path of travel of the substrate relative to the bolster into general alignment with successive ones of a plurality of defined areas presenting a discrete row of said defined areas between successive shifting of the substrate by the delivery unit; and die unit registration mechanism connected to the bolster operable to sense the registration indicium associated with each respective individual defined area when the die unit is in general alignment therewith, said mechanism being responsive to said sensing to rotate and shift the bolster and thereby the die unit to a required extent to bring the die unit into registration with said respective defined area to be cut by the die unit.

19. A die cutting press as set forth in claim 18, wherein is provided power units connected to said bolster for rotating the bolster about said pivot axis thereof through a θ angle of the substrate and in a Y direction transverse of the direction of travel of the substrate, through displacements sufficient only to bring the die unit into precise alignment with an individual defined area which has initially been brought into general alignment with the die unit.

20. A die cutting press as set forth in claim 18, wherein is provided power units connected to said bolster for simultaneously rotating the bolster about said pivot axis thereof through a θ angle and for shifting the bolster in an X direction of travel of the substrate and in a Y direction transverse ofthe direction of travel of the substrate, through displacements sufficient only to bring the die unit into precise alignment with an individual defined area which has initially been brought into general alignment with the die unit.

21. A method of die cutting individual defined areas from a plurality of defined areas of a relatively thin substrate susceptible to deformation and warpage during its manufacture, said defined areas being arranged in discrete rows both along and across the substrate, and wherein at least one die registration indicium is provided in association with each of the defined areas, and utilizing a press having a base platen, a bolster shiftably mounted on the base platen and rotatable about a pivot axis, and a die unit moveable toward and away from the base platen with the die unit being supported on and movable with the bolster, said method comprising:

directing the substrate along a path to successively shift the substrate in-order to bring an individual defined area into general alignment with the die unit;

successively shifting the die unit in a direction perpendicular to said path of travel of the substrate relative to the bolster into general alignment with successive ones of a plurality of defined areas presenting a discrete row of said defined areas between successive shifting of the substrate by the delivery unit;

sensing the registration indicium associated with each respective individual defined area when the die unit is in general alignment therewith;

providing an output response to said sensing to rotate and shift the bolster and thereby the die unit to a required extent to bring the die unit into registration with said respective defined area to be cut by the die unit.

22. A die cutting method as set forth in claim 21, wherein is included simultaneously rotating and shifting the bolster and shifting the substrate to an extent as required to align the die unit with the respective defined area.

23. A die cutting method as set forth in claim 21, wherein is included rotating the bolster an amount and shifting the bolster a distance to obtain registration of the die unit with an individual defined area generally aligned with the die unit as a finction of the distance of the particular individual defined area generally aligned with the die unit from the pivot axis of the bolster.

24. A die cutting method as set forth in claim 21, wherein is included providing reference image data representative of the desired position of the indicium associated with the respective defined area and thereby that defined area with respect to the die unit, creating an image of said indicium associated with said respective defined area when the defined area is in general alignment with said die unit to generate position data indicative of the initial location of said indicium with respect to the die unit, comparing the reference image data with the indicia image data, and repositioning the die unit with respect to the respective defined area to bring the image data and the reference data into substantial juxtaposition thus bringing the die unit into precise alignment with the respective defined area.

25. A die cutting method as set forth in claim 21, wherein said defined areas ofthe substrate are arranged in a plurality of rows extending along respective first axes of the substrate and in a plurality of cross-rows extending along respective second axes of the substrate at an angle with respect to the first axes, and wherein the die unit is successively shifted relative to the bolster into general alignment with successive ones of said defined areas of a cross-row thereof prior to shifting of the substrate to bring another defined area of a second cross-row of defined areas into general alignment with the die unit.

26. A die cutting method as set forth in claim 24, wherein two die registration indicia are provided in association with each of the defined areas of the substrate and the substrate delivery unit is operable to shift the substrate along an X axis of the substrate, a θ angle operator is connected to the bolster for rotating the bolster about the pivot axis thereof, a Y axis operator is connected to the bolster for shifting the bolster along a Y axis perpendicular to said X axis, and wherein is included the steps of determining the distance between said θ angle operator and the pivot axis of the bolster, the distance between the center point of the die unit and the pivot point of the bolster, the distance between the pair of indicia associated with each defined area of the substrate, and the angle between an imaginary line through the pair of indicia of said respective defined area and an imaginary line between the θ) angle operator and the pivot axis of the bolster, and actuating the Y axis operator and the θ angle operator based on said determinations to shift and rotate the bolster to an extent to shift and rotate the bolster as required to bring the die unit into registration with said respective defined area to be cut by the die unit.

27. A die cutting method as set forth in claim 22, wherein is included determining the relationship of the two indicia associated with said respective defined area with respect to the reference image data representative of the desired position of the indicia along said X axis, and thereafter actuating the substrate delivery to an extent to move the substrate a distance and in a direction required to bring the respective defined area into desired alignment with the die unit along the X axis.

28. A die cutting method as set forth in claim 27, wherein is included rotating the bolster an amount and shifting the bolster a distance to obtain registration of the die unit with an individual defined area generally aligned with the die unit as a function of the distance of the particular individual defined area generally aligned with the die unit from the pivot axis of the bolster.

29. A die cutting method as set forth in claim 24, wherein the functions of rotation and shifting of the bolster and shifting of the substrate to bring the die unit into precise registration with said respective defined area to be cut by the die unit are carried out by the steps of shifting and rotating the bolster and shifting the substrate to conform with the equations $\Delta X_+ = (\frac{1}{2} \Delta X_+) + (D/T)(\Delta X_-)$, $\Delta Y = \frac{1}{2} \Delta Y_+$ and $\Delta T_x = (B/T)\Delta X_-$ where $\Delta X_-$ refers to $\Delta X_+ = \Delta X1 + \Delta X2$, $\Delta X_- = \Delta X1 - \Delta X2$, and $\Delta Y_+ = \Delta Y1 + \Delta Y2$.

* * * * *